(12) United States Patent
Ueno et al.

(10) Patent No.: US 10,370,536 B2
(45) Date of Patent: Aug. 6, 2019

(54) RESIN COMPOSITION, PREPREG, RESIN SHEET, METAL FOIL-CLAD LAMINATE, AND PRINTED WIRING BOARD

(71) Applicant: MITSUBISHI GAS CHEMICAL COMPANY, INC., Tokyo (JP)

(72) Inventors: Yoshitaka Ueno, Tokyo (JP); Masataka Kudo, Tokyo (JP); Michio Yaginuma, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 254 days.

(21) Appl. No.: 15/118,302

(22) PCT Filed: Feb. 19, 2015

(86) PCT No.: PCT/JP2015/054686
§ 371 (c)(1),
(2) Date: Aug. 11, 2016

(87) PCT Pub. No.: WO2015/133292
PCT Pub. Date: Sep. 11, 2015

(65) Prior Publication Data
US 2017/0158854 A1 Jun. 8, 2017

(30) Foreign Application Priority Data
Mar. 6, 2014 (JP) ................. 2014-043504

(51) Int. Cl.

| | | |
|---|---|---|
| B32B 15/08 | (2006.01) |
| B32B 15/082 | (2006.01) |
| B32B 15/092 | (2006.01) |
| B32B 27/18 | (2006.01) |
| B32B 27/28 | (2006.01) |
| B32B 27/30 | (2006.01) |
| B32B 27/38 | (2006.01) |
| H05K 1/03 | (2006.01) |
| C08J 5/24 | (2006.01) |
| C08L 63/00 | (2006.01) |
| C08L 63/02 | (2006.01) |
| C08L 63/04 | (2006.01) |
| C08L 71/12 | (2006.01) |
| C08K 5/5399 | (2006.01) |
| B32B 27/20 | (2006.01) |
| B32B 5/02 | (2006.01) |
| B32B 27/06 | (2006.01) |
| C08K 3/36 | (2006.01) |
| C08K 7/18 | (2006.01) |
| C08L 79/04 | (2006.01) |
| C08G 73/06 | (2006.01) |

(52) U.S. Cl.
CPC ......... *C08L 71/126* (2013.01); *B32B 5/02* (2013.01); *B32B 15/08* (2013.01); *B32B 27/06* (2013.01); *B32B 27/20* (2013.01); *C08J 5/24* (2013.01); *C08K 3/36* (2013.01); *C08K 5/5399* (2013.01); *C08K 7/18* (2013.01); *C08L 63/00* (2013.01); *C08L 71/12* (2013.01); *H05K 1/0346* (2013.01); *H05K 1/0373* (2013.01); *B32B 2262/101* (2013.01); *B32B 2307/202* (2013.01); *B32B 2307/3065* (2013.01); *B32B 2457/00* (2013.01); *B32B 2457/08* (2013.01); *C08G 73/0655* (2013.01); *C08J 2371/12* (2013.01); *C08L 79/04* (2013.01); *C08L 2203/20* (2013.01); *H05K 2201/0145* (2013.01); *H05K 2201/0209* (2013.01)

(58) Field of Classification Search
None
See application file for complete search history.

(56) References Cited

U.S. PATENT DOCUMENTS

| | | | | |
|---|---|---|---|---|
| 9,394,439 B2 * | 7/2016 | Itoh | .............. | C08L 71/126 |
| 2009/0203279 A1 * | 8/2009 | Mori | .............. | C08G 65/44 |
| | | | | 442/233 |
| 2015/0017449 A1 | 1/2015 | Itoh et al. | | |

FOREIGN PATENT DOCUMENTS

| | | |
|---|---|---|
| EP | 2 832 797 | 2/2015 |
| JP | 10-273518 | 10/1998 |
| JP | 10-292122 | 11/1998 |
| JP | 11-35795 | 2/1999 |
| JP | 2002-194212 | 7/2002 |
| JP | 2002-194235 | 7/2002 |
| JP | 2003-221430 | 8/2003 |
| JP | 2003-253043 | 9/2003 |
| JP | 2005-120173 | 5/2005 |
| JP | 2013-035925 | 2/2013 |
| JP | 2013-75836 | 4/2013 |
| JP | 2013-75940 | 4/2013 |
| JP | 2013-75942 | 4/2013 |
| JP | 5426477 | 2/2014 |
| JP | 2014-198778 | 10/2014 |
| TW | 201343784 A | 11/2013 |
| WO | 2013/146302 | 10/2013 |

OTHER PUBLICATIONS

Machine Translation of WO 2013/146302 via WIPO website.*
Machine translation of JP 2013-075940 A (no date).*
Search Report issued in Japan Patent Application No. PCT/JP2015/054686, dated May 26, 2015.
International Preliminary Report on Patentability issued in PCT/JP2015/054686, dated Sep. 6, 2016.

* cited by examiner

*Primary Examiner* — Michael J Feely
(74) *Attorney, Agent, or Firm* — Greenblum & Bernstein, P.L.C.

(57) ABSTRACT

A resin composition comprising a polyphenylene ether (A) having a number average molecular weight of 500 to 5000; a cyclophosphazene compound (B); a non-halogen-based epoxy resin (C); a cyanate compound (D); and a filler (E).

15 Claims, No Drawings

RESIN COMPOSITION, PREPREG, RESIN SHEET, METAL FOIL-CLAD LAMINATE, AND PRINTED WIRING BOARD

TECHNICAL FIELD

The present invention relates to a resin composition useful for a printed wiring board material, a prepreg, a resin sheet, a metal foil-clad laminate, and a printed wiring board.

BACKGROUND ART

In recent years, information terminal equipment including personal computers and servers, and communication equipment such as Internet routers and optical communication have been required to process massive information at high speed, and the speed and frequency of electrical signals have become higher. With this, in addition to conventionally required characteristics such as flame retardancy, heat resistance, and peel strength with copper foil and the like, a lower dielectric constant and a lower dielectric loss tangent have been required for printed wiring board materials used in the equipment. In order to meet these characteristic requirements, various attempts have been made in the configurations of resin compositions.

In order to provide electrical characteristics to such materials, a method of containing, in a resin composition, a resin having a low dielectric constant and a low dielectric loss tangent such as a fluororesin, a cyanate resin, a polyphenylene ether resin, or a vinyl compound mainly comprising styrene is known (for example, see Patent Literature 1). Generally, a laminate using such a compound has poor flame retardancy, and therefore in order to provide flame retardancy, it is necessary to contain a halogen-based compound in a resin composition (for example, see Patent Literatures 2 and 3). However, when a halogen-based compound is used, environmental problems arise, for example, harmful substances such as dioxin may be generated during burning.

Therefore, as methods for achieving flame retardancy without comprising any halogen compound at all, for example, studies of adding compounds mainly comprising phosphorus or nitrogen are made (for example, see Patent Literatures 4 to 8).

CITATION LIST

Patent Literature

Patent Literature 1: Japanese Patent Laid-Open No. 2002-194212

Patent Literature 2: Japanese Patent Laid-Open No. H10-273518

Patent Literature 3: Japanese Patent Laid-Open No. 2005-120173

Patent Literature 4: Japanese Patent Laid-Open No. H11-035795

Patent Literature 5: Japanese Patent Laid-Open No. 2002-194235

Patent Literature 6: Japanese Patent Laid-Open No. H10-292122

Patent Literature 7: Japanese Patent Laid-Open No. 2003-221430

Patent Literature 8: International Publication No. WO 2013/146302

SUMMARY OF INVENTION

Technical Problem

However, when a nitrogen compound is used, harmful nitrogen oxides may be produced. In addition, when a phosphorus compound is used, a problem is that as the amount of the phosphorus compound added is increased in order to achieve flame retardancy, the heat resistance deteriorates, that is, the glass transition temperature (Tg) of the resin composition decreases.

The present invention has been made in view of the above problems, and it is an object of the present invention to provide a resin composition with which a prepreg, a resin sheet, a metal foil-clad laminate, and a printed wiring board that are excellent in flame retardancy, a coefficiency of thermal expansion, heat resistance after moisture absorption, peel strength with copper foil, glass transition temperature, and electrical characteristics are obtained, and a prepreg, a resin sheet, a metal foil-clad laminate, and a printed wiring board using the resin composition.

Solution to Problem

The present inventors have diligently studied the above problems and, as a result, found that the above problems can be solved by using a resin composition containing polyphenylene ether having a particular number average molecular weight, a particular cyclophosphazene compound, a non-halogen-based epoxy resin, a cyanate compound, and a filler, leading to the completion of the present invention.

Specifically, the present invention is as follows:

[1]

A resin composition comprising:

a polyphenylene ether (A) having a number average molecular weight of 500 to 5000;

a cyclophosphazene compound (B) represented by the following formula (13);

a non-halogen-based epoxy resin (C);

a cyanate compound (D); and a filler (E),

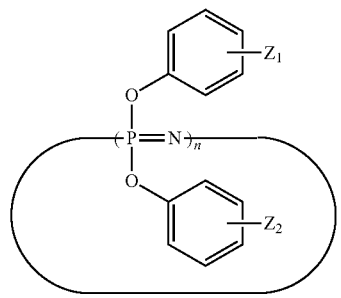

(13)

wherein $Z_1$ and $Z_2$ each independently represent a vinyl group or a hydrogen atom, at least either one of $Z_1$ and $Z_2$ is a vinyl group, and n represents an integer of 3 to 8.

[2]

The resin composition according to [1], wherein the polyphenylene ether (A) comprises a compound represented by the following formula (4):

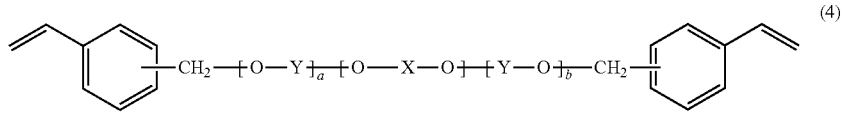

wherein X represents a group represented by the following formula (5) or the following formula (6), Y each independently represents a group represented by the following formula (7), a and b each represent an integer of 0 to 100, and at least either one of a and b is 1 or more,

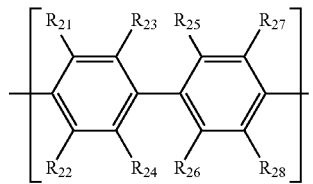

wherein $R_{21}$, $R_{22}$, $R_{23}$, $R_{27}$, and $R_{28}$ each independently represent an alkyl group having 6 or less carbon atoms or a phenyl group, and $R_{24}$, $R_{25}$, and $R_{26}$ each independently represent a hydrogen atom, an alkyl group having 6 or less carbon atoms, or a phenyl group,

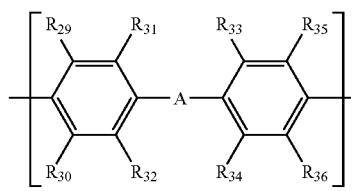

wherein $R_{29}$, $R_{30}$, $R_{31}$, $R_{32}$, $R_{33}$, $R_{34}$, $R_{35}$, and $R_{36}$ each independently represent a hydrogen atom, an alkyl group having 6 or less carbon atoms, or a phenyl group, and A represents a linear, branched, or cyclic divalent hydrocarbon group having 20 or less carbon atoms,

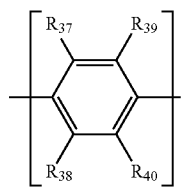

wherein $R_{39}$ and $R_{40}$ each independently represent an alkyl group having 6 or less carbon atoms or a phenyl group, and $R_{37}$ and $R_{38}$ each independently represent a hydrogen atom, an alkyl group having 6 or less carbon atoms, or a phenyl group.

[3]
The resin composition according to [1] or [2], wherein a content of the polyphenylene ether (A) is 40 to 80 parts by mass based on 100 parts by mass of a total of the (A) to (D) components.

[4]
The resin composition according to any one of [1] to [3], wherein a content of the cyclophosphazene compound (B) is 10 to 30 parts by mass based on 100 parts by mass of the total of the (A) to (D) components.

[5]
The resin composition according to any one of [1] to [4], wherein the non-halogen-based epoxy resin (C) comprises any one or more selected from the group consisting of a naphthalene-modified epoxy resin, a cresol novolac-based epoxy resin, and a bisphenol A-based epoxy resin.

[6]
The resin composition according to any one of [1] to [5], wherein a content of the non-halogen-based epoxy resin (C) is 2 to 20 parts by mass based on 100 parts by mass of the total of the (A) to (D) components.

[7]
The resin composition according to any one of [1] to [6], wherein the cyanate compound (D) comprises a bisphenol A-based cyanate compound and/or a naphthol aralkyl-based cyanate compound.

[8]
The resin composition according to any one of [1] to [7], wherein a content of the cyanate compound (D) is 5 to 30 parts by mass based on 100 parts by mass of the total of the (A) to (D) components.

[9]
The resin composition according to any one of [1] to [8], wherein a content of the filler (E) is 20 to 150 parts by mass based on 100 parts by mass of the total of the (A) to (D) components.

[10]
The resin composition according to any one of [1] to [9], wherein the filler (E) comprises a silica.

[11]
The resin composition according to any one of [1] to [10], for use in a prepreg, a metal foil-clad laminate, a single-layer resin sheet, a laminated resin sheet, or a printed wiring board for in-vehicle use.

[12]
A prepreg comprising:
a base material; and
the resin composition according to any one of [1] to [11] with which the base material is impregnated or coated.

[13]
A metal foil-clad laminate comprising:
a laminate of one or more of the prepregs according to [12]; and
metal foil laminate-molded on one surface or both surfaces of the laminate.

[14]
A single-layer resin sheet obtained by molding the resin composition according to any one of [1] to [11] into a sheet shape.

[15]
A laminated resin sheet comprising:
a sheet base material; and
the resin composition according to any one of [1] to [11] applied and dried on one surface or both surfaces of the sheet base material.

[16]
A printed wiring board comprising:
an insulating layer; and
a conductor layer formed on one surface or both surfaces of the insulating layer, wherein
the insulating layer comprises the resin composition according to any one of [1] to [11].

Advantageous Effect of Invention

According to the present invention, it is possible to provide a resin composition with which a prepreg, a resin sheet, a metal foil-clad laminate, and a printed wiring board that are excellent in flame retardancy, a coefficient of thermal expansion, heat resistance after moisture absorption, peel strength with copper foil, glass transition temperature, and electrical characteristics are obtained, and a prepreg, a resin sheet, a metal foil-clad laminate, and a printed wiring board using the resin composition. The industrial practicality of the present invention is extremely high.

DESCRIPTION OF EMBODIMENT

A mode for carrying out the present invention (hereinafter referred to as "this embodiment") will be described in detail below, but the present invention is not limited to this, and various modifications can be made without departing from the spirit thereof.

[Resin Composition]
A resin composition in this embodiment comprises polyphenylene ether (A) having a number average molecular weight of 500 to 5000; a cyclophosphazene compound (B) represented by the following formula (13); a non-halogen-based epoxy resin (C); a cyanate compound (D); and a filler (E).

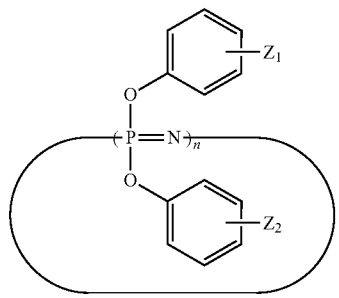
(13)

wherein $Z_1$ and $Z_2$ each independently represent a vinyl group or a hydrogen atom, at least either one of $Z_1$ and $Z_2$ is a vinyl group, and n represents an integer of 3 to 8.

By having the above configuration, the resin composition in this embodiment provides a prepreg, a resin sheet, a metal foil-clad laminate, and a printed wiring board that are excellent in flame retardancy, a coefficient of thermal expansion, heat resistance after moisture absorption, peel strength with copper foil, glass transition temperature, and electrical characteristics. In addition, the resin composition in this embodiment can achieve the same effect even when it contains only non-halogen-based compounds as components.

[Polyphenylene Ether (A)]
The polyphenylene ether (A) used in this embodiment is not particularly limited but is preferably, for example, a polymer comprising a repeating unit represented by the following formula (1). In addition, the polyphenylene ether (A) may further comprise a repeating unit represented by the following formula (2) and/or a repeating unit represented by the following formula (3).

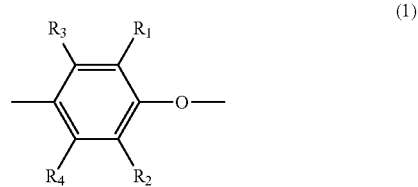
(1)

wherein $R_1$, $R_2$, $R_3$, and $R_4$ each independently represent an alkyl group having 6 or less carbon atoms, an aryl group, a halogen atom, or a hydrogen atom.

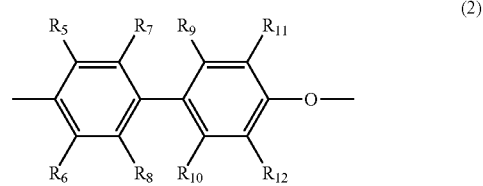
(2)

wherein $R_5$, $R_6$, $R_7$, $R_{11}$, and $R_{12}$ each independently represent an alkyl group having 6 or less carbon atoms or a phenyl group, and $R_8$, $R_9$, and $R_{10}$ each independently represent a hydrogen atom, an alkyl group having 6 or less carbon atoms, or a phenyl group.

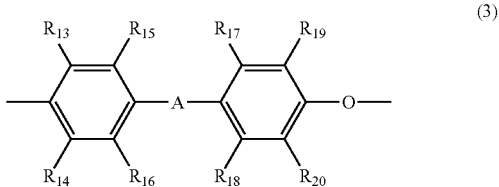
(3)

wherein $R_{13}$, $R_{14}$, $R_{15}$, $R_{16}$, $R_{17}$, $R_{18}$, $R_{19}$, and $R_{20}$ each independently represent a hydrogen atom, an alkyl group having 6 or less carbon atoms, or a phenyl group, and A represents a linear, branched, or cyclic divalent hydrocarbon group having 20 or less carbon atoms.

Further, the polyphenylene ether (A) may have a substituent. The substituent is not particularly limited. Examples thereof include ethylenic unsaturated groups such as a vinylbenzyl group, an epoxy group, an amino group, a hydroxyl group, a mercapto group, a carboxyl group, and a silyl group. Among these, ethylenic unsaturated groups are preferred. The polyphenylene ether (A) having such a substituent is also referred to as "modified polyphenylene ether" below. One polyphenylene ether (A) may be used alone, or two or more polyphenylene ethers (A) may be used in combination.

The above ethylenic unsaturated groups are not particularly limited. Examples thereof include alkenyl groups such as an ethenyl group, an allyl group, a methallyl group, a propenyl group, a butenyl group, a hexenyl group, and an octenyl group; cycloalkenyl groups such as a cyclopentenyl group and a cyclohexenyl group; and alkenylaryl groups such as a vinylbenzyl group and a vinylnaphthyl group. Among these, a vinylbenzyl group is preferred in terms of electrical characteristics and low water absorbency.

The position of the substituent is not particularly limited. Examples thereof include both ends of the polyphenylene ether chain, one end of the polyphenylene ether chain, a side chain of the polyphenylene ether chain, or combinations thereof. Among these, the polyphenylene ether (A) having ethylenic unsaturated groups at both ends is preferred in terms of heat resistance. When the polyphenylene ether (A) has two or more substituents, the substituents may be the same or different.

Of the above modified polyphenylene ether, polyphenylene ether having ethylenic unsaturated groups at both ends is preferred. Such polyphenylene ether (A) is not particularly limited. Examples thereof include compounds represented by the following formula (4). By using such polyphenylene ether (A), the heat resistance and the low water absorbency tend to improve more.

represents a linear, branched, or cyclic divalent hydrocarbon group having 20 or less carbon atoms.

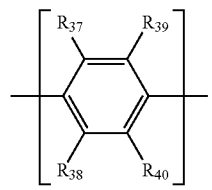

(7)

wherein $R_{39}$ and $R_{40}$ each independently represent an alkyl group having 6 or less carbon atoms or a phenyl group, and $R_{37}$ and $R_{38}$ each independently represent a hydrogen atom, an alkyl group having 6 or less carbon atoms, or a phenyl group.

The divalent hydrocarbon group represented by A in the above formula (6) is not particularly limited. Examples thereof include methylene, ethylidene, 1-methylethylidene, 1,1-propylidene, 1,4-phenylenebis(1-methylethylidene), 1,3-phenylenebis(1-methylethylidene), cyclohexylidene, phenylmethylene, naphthylmethylene, and 1-phenylethylidene.

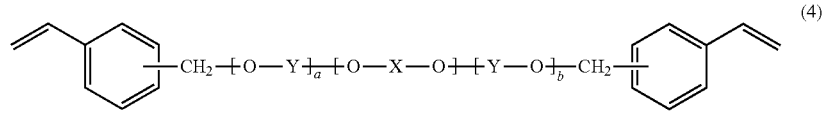

(4)

wherein X represents a group represented by the following formula (5) or the following formula (6), Y each independently represents a group represented by the following formula (7), a and b each represent an integer of 0 to 100, and at least either one of a and b is 1 or more.

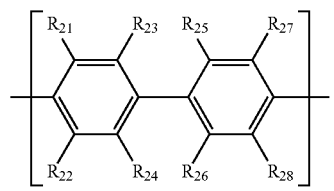

(5)

wherein $R_{21}$, $R_{22}$, $R_{23}$, $R_{27}$, and $R_{28}$ each independently represent an alkyl group having 6 or less carbon atoms or a phenyl group, and $R_{24}$, $R_{25}$, and $R_{26}$ each independently represent a hydrogen atom, an alkyl group having 6 or less carbon atoms, or a phenyl group.

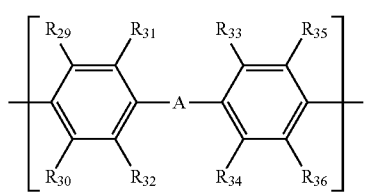

(6)

wherein $R_{29}$, $R_{30}$, $R_{31}$, $R_{32}$, $R_{33}$, $R_{34}$, $R_{35}$, and $R_{36}$ each independently represent a hydrogen atom, an alkyl group having 6 or less carbon atoms, or a phenyl group, and A The compound represented by formula (4) may comprise one group represented by formula (7) or two or more groups represented by formula (7). When the compound represented by formula (4) comprises two or more groups represented by formula (7), different groups represented by formula (7) may be randomly arranged, or the same group represented by formula (7) may be arranged in the form of blocks.

Of the polyphenylene ether (A) represented by the above formula (4), polyphenylene ether in which $R_{21}$, $R_{22}$, $R_{23}$, $R_{27}$, $R_{28}$, $R_{39}$, and $R_{40}$ are each an alkyl group having 3 or less carbon atoms, and $R_{24}$, $R_{25}$, $R_{26}$, $R_{29}$, $R_{30}$, $R_{31}$, $R_{32}$, $R_{33}$, $R_{34}$, $R_{35}$, $R_{36}$, $R_{37}$, and $R_{38}$ are each a hydrogen atom or an alkyl group having 3 or less carbon atoms is preferred, and particularly polyphenylene ether in which X represented by the above formula (5) or the above formula (6) is a group represented by the following formula (8), the following formula (9), or the following formula (10), and Y represented by the above formula (7) is the following formula (11) or the following formula (12) or is a structure in which the following formula (11) and the following formula (12) are randomly arranged is more preferred.

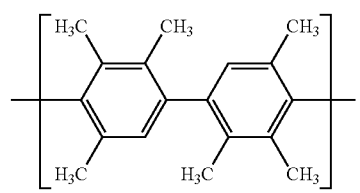

(8)

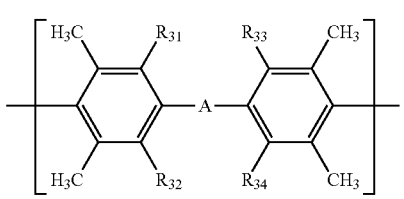
(9)

wherein $R_{31}$, $R_{32}$, $R_{33}$, and $R_{34}$ are each independently a hydrogen atom or a methyl group; and -A- is a linear, branched, or cyclic divalent hydrocarbon group having 20 or less carbon atoms.

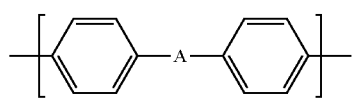
(10)

wherein A is a linear, branched, or cyclic divalent hydrocarbon group having 20 or less carbon atoms.

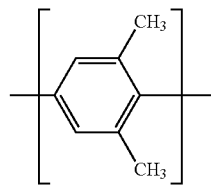
(11)

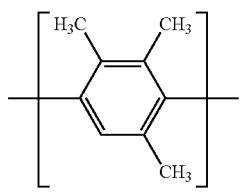
(12)

The method for producing the polyphenylene ether (A) having the structure represented by the above formula (4) is not particularly limited. Examples thereof include a method of oxidatively coupling a bifunctional phenol compound and a monofunctional phenol compound to obtain a bifunctional phenylene ether oligomer, and vinylbenzyl-etherifying the terminal phenolic hydroxyl groups of the obtained bifunctional phenylene ether oligomer.

In addition, the method for producing another modified polyphenylene ether is also not particularly limited. For example, examples of a method for producing the polyphenylene ether (A) modified with a vinylbenzyl group include a method of dissolving a bifunctional phenylene ether oligomer and vinylbenzyl chloride in a solvent, and adding a base under heating and stirring for reaction. In addition, examples of a method for producing the polyphenylene ether (A) modified with a carboxyl group include a method of melting and kneading an unsaturated carboxylic acid and a functional derivative thereof with polyphenylene ether in the presence or absence of a radical initiator for reaction; or for the polyphenylene ether (A) modified with a carboxyl group, a method of dissolving polyphenylene ether and an unsaturated carboxylic acid and/or a functional derivative thereof in an organic solvent in the presence or absence of a radical initiator for reaction in the solution.

The number average molecular weight of the polyphenylene ether (A) is 500 to 5000, preferably 700 to 3500, and more preferably 900 to 2500 in terms of polystyrene by a GPC method. When the number average molecular weight of the polyphenylene ether (A) is 500 or more, the resin composition is less likely to stick when provided in the form of a coating film. In addition, when the number average molecular weight of the polyphenylene ether (A) is 5000 or less, a decrease in solubility in a solvent can be prevented.

The content of the polyphenylene ether (A) in this embodiment is preferably 40 to 80 parts by mass, more preferably 45 to 80 parts by mass, and further preferably 50 to 77 parts by mass, based on 100 parts by mass of the total of the (A) to (D) components. When the content of the polyphenylene ether (A) is in the above range, the electrical characteristics and the flame retardancy tend to improve more. Particularly, when the content of the polyphenylene ether (A) is 45 to 77 parts by mass, the electrical characteristics, flame retardancy, and peel strength tend to improve more.

The vinyl group equivalent (g/eq.) of the polyphenylene ether (A) is preferably 250 to 2600 g/eq., more preferably 350 to 1800 g/eq., and further preferably 450 to 1400 g/eq. When the vinyl group equivalent (g/eq.) of the polyphenylene ether (A) is in the above range, the heat resistance and the low water absorbency tend to improve more.

[Cyclophosphazene Compound (B)]

The cyclophosphazene compound (B) used in this embodiment is a compound represented by the following formula (13). By using the cyclophosphazene compound (B) having a phosphorus atom and a nitrogen atom, the flame retardancy of the obtained printed wiring board material improves. In addition, when the cyclophosphazene compound (B) has a reactive vinyl group, the cyclophosphazene compounds (B) can polymerize together, and the cyclophosphazene compound (B) and other resins can polymerize, and thus the glass transition temperature of the cured product can be improved, and the coefficiency of thermal expansion can be decreased.

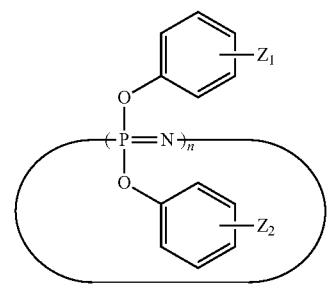
(13)

wherein $Z_1$ and $Z_2$ each independently represent a vinyl group or a hydrogen atom, at least either one of $Z_1$ and $Z_2$ is a vinyl group, and n represents an integer of 3 to 8.

The method for producing the cyclophosphazene compound (B) represented by the above formula (13) is not particularly limited. Examples thereof include a method of using a hexahalogenated cyclotriphosphazene such as hexachlorocyclotriphosphazene as a raw material and replacing the halogen atoms of this hexahalogenated cyclotriphosphazene by aryloxy groups of phenoxy groups and vinylphenoxy groups. Here, as the method for replacing halogen atoms bonded to the phosphorus atoms of a hexahalogenated cyclotriphosphazene by aryloxy groups, for example, a method of reacting a mixture of vinylphenol and phenol with a hexahalogenated cyclotriphosphazene is known.

The content of the cyclophosphazene compound (B) in this embodiment is preferably 10 to 30 parts by mass, more preferably 12 to 25 parts by mass, and further preferably 15 to 20 parts by mass, based on 100 parts by mass of the total of the (A) to (D) components. When the content of the cyclophosphazene compound (B) is in the above range, the heat resistance tends to improve more. Particularly, when the content of the cyclophosphazene compound (B) is 15 to 25 parts by mass, the heat resistance, flame retardancy, and electrical characteristics tend to improve more.

The vinyl group equivalent (g/eq.) of the cyclophosphazene compound (B) is preferably 140 to 1200 g/eq., more preferably 140 to 1000 g/eq., and further preferably 140 to 800 g/eq. When the vinyl group equivalent (g/eq.) of the cyclophosphazene compound (B) is in the above range, the heat resistance tends to improve more.

The ratio of the vinyl group equivalent of the cyclophosphazene compound (B) to the vinyl group equivalent of the polyphenylene ether (A) is preferably in the range of 0.2 to 4, more preferably in the range of 0.3 to 3, and further preferably in the range of 0.4 to 2. When the ratio is in the above range, the heat resistance tends to improve more.

[Non-Halogen-Based Epoxy Resin (C)]

The non-halogen-based epoxy resin (C) used in this embodiment is not particularly limited as long as it is a non-halogen-based compound having two or more epoxy groups in one molecule. Specific examples thereof include bisphenol A-based epoxy resins, bisphenol F-based epoxy resins, phenol novolac-based epoxy resins, bisphenol A novolac-based epoxy resins, biphenyl aralkyl-based epoxy resins, cresol novolac-based epoxy resins, polyfunctional phenol-based epoxy resins, naphthalene-modified epoxy resins, naphthalene skeleton-modified novolac-based epoxy resins, phenol aralkyl-based epoxy resins, biphenyl-based epoxy resins, alicyclic epoxy resins, polyol-based epoxy resins, phosphorus-containing epoxy resins, glycidyl amines, glycidyl esters, compounds obtained by epoxidizing double bonds of butadiene and the like, and compounds obtained by the reaction of hydroxyl group-containing silicone resins with epichlorohydrin. Among these, any one or more selected from the group consisting of naphthalene-modified epoxy resins, cresol novolac-based epoxy resins, and bisphenol A-based epoxy resins are preferred. By using such a non-halogen-based epoxy resin (C), the heat resistance tends to improve more. One non-halogen-based epoxy resin (C) may be used alone, or two or more non-halogen-based epoxy resins (C) may be used in combination.

The content of the non-halogen-based epoxy resin (C) in this embodiment is preferably 2 to 20 parts by mass, more preferably 3 to 15 parts by mass, and further preferably 3 to 10 parts by mass, based on 100 parts by mass of the total of the (A) to (D) components. When the content of the non-halogen-based epoxy resin (C) is in the above range, the metal adhesiveness tends to improve more. Particularly, when the content of the non-halogen-based epoxy resin (C) is 3 to 15 parts by mass, the heat resistance, peel strength, and electrical characteristics tend to improve more.

[Cyanate Compound (D)]

The cyanate compound (D) used in this embodiment is not particularly limited as long as it is a compound having two or more cyanato groups in the molecule. Specific examples thereof include bisphenol A-based cyanate resins and prepolymers thereof, naphthol aralkyl-based cyanate resins, 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-dicyanatophenyl)methane, 2,2-bis(4-cyanatophenyl)propane, 2,2-bis(3,5-dibromo-4-cyanatophenyl)propane, bis(4-cyanatophenyl) ether, bis(4-cyanatophenyl) thioether, bis(4-cyanatophenyl) sulfone, tris(4-cyanatophenyl) phosphite, tris(4-cyanatophenyl) phosphate, and cyanate compounds obtained by the reaction of novolacs with cyanogen halides. Among these, bisphenol A-based cyanate compounds and prepolymers thereof, and naphthol aralkyl-based cyanate compounds are preferred, and bisphenol A-based cyanate compounds and/or naphthol aralkyl-based cyanate compounds are more preferred. By using such a cyanate compound (D), the heat resistance tends to improve more. One of these cyanate compounds may be used alone, or two or more of these cyanate compounds may be used in combination.

The content of the cyanate compound (D) in this embodiment is preferably 5 to 30 parts by mass, more preferably 5 to 20 parts by mass, based on 100 parts by mass of the total of the (A) to (D) components. When the content of the cyanate compound (D) is in the above range, the electrical characteristics and the flame retardancy tend to improve more.

In addition, the equivalent ratio of the cyanato groups of the cyanate compound (D) to the epoxy groups of the non-halogen-based epoxy resin (C) is preferably in the range of 0.4 to 8, more preferably in the range of 0.5 to 6, and further preferably in the range of 0.6 to 4. When the equivalent ratio of cyanato groups is in the above range, the electrical characteristics, heat resistance, and flame retardancy tend to improve more.

[Filler (E)]

As the filler (E) used in this embodiment, known inorganic fillers and organic fillers can be appropriately used, and the type of the filler (E) is not particularly limited. Among them, those generally used in laminate applications can be preferably used.

The inorganic fillers are not particularly limited. Examples thereof include silicas such as natural silica, fused silica, synthetic silica, amorphous silica, AEROSIL, and hollow silica; silicon compounds such as white carbon; metal oxides such as titanium white, zinc oxide, magnesium oxide, and zirconium oxide; metal nitrides such as boron nitride, aggregated boron nitride, silicon nitride, and aluminum nitride; metal sulfates such as barium sulfate; metal hydrates such as aluminum hydroxide, heat-treated products of aluminum hydroxide (products obtained by heat-treating aluminum hydroxide to decrease some of the water of crystallization), boehmite, and magnesium hydroxide; molybdenum compounds such as molybdenum oxide and zinc molybdate; zinc compounds such as zinc borate and zinc stannate; alumina, clay, kaolin, talc, calcined clay, calcined kaolin, calcined talc, mica, E-glass, A-glass, NE-glass, C-glass, L-glass, D-glass, S-glass, M-glass G20, glass short fibers (including glass fine powders of E-glass, T-glass, D-glass, S-glass, Q-glass, and the like), hollow glass, and spherical glass.

In addition, the organic fillers are not particularly limited. Examples thereof include rubber powders such as styrene-based powders, butadiene-based powders, and acrylic powders; core-shell-based rubber powders; silicone resin powders; silicone rubber powders; and silicone composite powders.

Among these, silicas and talc are preferred, and in terms of electrical characteristics, silicas are particularly preferred. One filler (E) may be used alone, or two or more fillers (E) may be used in combination.

The average particle diameter (D50) of the filler (E) is preferably 0.1 to 3 μm, more preferably 0.2 to 2 μm, and further preferably 0.3 to 1 μm. When the average particle diameter (D50) of the filler (E) is in the above range, the dispersibility of the filler (E) in the resin composition tends to improve more, the flow characteristics during molding tend to improve more, and breakage when a small diameter drill bit is used tends to be more suppressed. Here, the "average particle diameter (D50)" means the diameter of a particle when the particle size distribution of a powder introduced in a predetermined amount into an aqueous dispersion medium is measured by a laser diffraction particle size distribution meter, the volumes are summed from a small particle, and 50% of the total volume is reached.

The content of the filler (E) in this embodiment is preferably 20 to 150 parts by mass, more preferably 40 to 120 parts by mass, and further preferably 50 to 110 parts by mass, based on 100 parts by mass of the total of the (A) to (D) components. When the content of the filler (E) is in the above range, the moldability tends to improve more. Particularly, when the content of the filler (E) is 40 to 120 parts by mass, the flame retardancy, peel strength, moldability, heat resistance, and electrical characteristics tend to improve more.

[Halogen-Based Compound]

The resin composition in this embodiment preferably contains no halogen-based compound. The content of a halogen-based compound is preferably 0 to 5 parts by mass, preferably 0 parts by mass, based on 100 parts by mass of the total of the (A) to (D) components. When the content of a halogen-based compound is in the above range, or no halogen-based compound is contained, the generation of harmful substances during combustion and the like can be suppressed.

[Phosphorus-Containing Cyanate]

The resin composition in this embodiment preferably contains no phosphorus-containing cyanate. The content of a phosphorus-containing cyanate is preferably 0 to 2 parts by mass, more preferably 0 to 1 part by mass, and further preferably 0 parts by mass, based on 100 parts by mass of the total of the (A) to (D) components. When the content of a phosphorus-containing cyanate is in the above range, or no phosphorus-containing cyanate is contained, the processability tends to improve more.

[Other Components]

When the filler (E) is used, a silane coupling agent and a wetting and dispersing agent may be used in combination in terms of improving the dispersibility of the filler (E), and the adhesive strength between the resins and the filler (E) and with a glass cloth.

(Silane Coupling Agent)

These silane coupling agents are not particularly limited as long as they are silane coupling agents generally used for the surface treatment of inorganic matter. Specific examples thereof include aminosilane-based compounds such as γ-aminopropyltriethoxysilane and N-β-(aminoethyl)-γ-aminopropyltrimethoxysilane; epoxysilane-based compounds such as γ-glycidoxypropyltrimethoxysilane; vinylsilane-based compounds such as γ-methacryloxypropyltrimethoxysilane; cationic silane-based compounds such as N-β-(N-vinylbenzylaminoethyl)-γ-aminopropyltrimethoxysilane hydrochloride; and phenyl-silane-based compounds. One silane coupling agent can be used, or two or more silane coupling agents can be used in appropriate combination.

In addition, as the wetting and dispersing agent, those generally used for paints can be preferably used, and the type of the wetting and dispersing agent is not particularly limited. Examples thereof include wetting and dispersing agents such as Disperbyk-110, 111, 180, and 161 and BYK-W996, W9010, and W903 manufactured by BYK Japan KK.

Various polymer compounds such as other thermosetting resins, thermoplastic resins, and oligomers thereof, and elastomers, other flame-retardant compounds, additives, and the like other than the above can also be used in combination in the resin composition in this embodiment as needed. These are not particularly limited as long as they are those generally used. Examples of the flame-retardant compounds include phosphates, melamine phosphate, phosphorus-containing epoxy resins, nitrogen compounds such as melamine and benzoguanamine, oxazine ring-containing compounds, and silicone-based compounds. As the additives, an ultraviolet absorbing agent, an antioxidant, a photopolymerization initiator, a fluorescent brightening agent, a photosensitizer, a dye, a pigment, a thickening agent, a lubricant, a defoaming agent, a dispersing agent, a leveling agent, a brightening agent, and the like can also be used in appropriate combination as desired.

(Curing Accelerator)

A curing accelerator can also be used in combination in the resin composition in this embodiment as needed, in order to appropriately adjust curing speed. Examples of such a compound include organic peroxides illustrated by benzoyl peroxide, lauroyl peroxide, acetyl peroxide, parachlorobenzoyl peroxide, di-tert-butyl-di-perphthalate, and the like; azo compounds such as azobisnitrile; tertiary amines such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; imidazoles such as 2-ethyl-4-methylimidazole, 2-phenyl-4-methylimidazole, and triphenylimidazole; monomeric phenols such as phenol, xylenol, cresol, resorcin, and catechol; organometallic salts such as lead naphthenate, lead stearate, zinc naphthenate, zinc octylate, tin oleate, dibutyltin maleate, manganese naphthenate, cobalt naphthenate, and acetylacetone iron; compounds obtained by dissolving these organometallic salts in monomeric hydroxyl group-containing compounds such as phenol and bisphenol; inorganic metal salts such as tin chloride, zinc chloride, and aluminum chloride; and organotin compounds such as dioctyltin oxide and other alkyltins and alkyltin oxides.

(Solvent)

Further, the resin composition in this embodiment may contain a solvent as needed. For example, when an organic solvent is used, the viscosity during the preparation of the resin composition decreases, and the handling properties are improved, and the impregnation properties into a glass cloth are enhanced. The type of the solvent is not particularly limited as long as it is one capable of dissolving some or all of a mixture of the polyphenylene ether (A) having a number average molecular weight of 500 to 5000, the cyclophosphazene compound (B), the non-halogen-based epoxy resin (C), and the cyanate compound (D). Specific examples thereof include, but are not particularly limited to, ketones such as acetone, methyl ethyl ketone, and methyl cellosolve, aromatic hydrocarbons such as toluene and xylene, amides such as dimethylformamide, and propylene glycol methyl ether and the acetate thereof. One solvent can be used alone, or two or more solvents can be used in combination.

The resin composition in this embodiment can be prepared according to an ordinary method, and the preparation method is not particularly limited as long as it is a method in which a resin composition uniformly containing the polyphenylene ether (A), the cyclophosphazene compound (B), the non-halogen-based epoxy resin (C), the cyanate compound (D), and the filler (E), and the above-described other optional components is obtained. For example, the resin composition in this embodiment can be easily prepared by sequentially blending the polyphenylene ether (A), the cyclophosphazene compound (B), the non-halogen-based epoxy resin (C), the cyanate compound (D), and the filler (E) with a solvent and sufficiently stirring the blend.

During the preparation of the resin composition in this embodiment, an organic solvent can be used as needed. The type of the organic solvent is not particularly limited as long as it is one capable of dissolving some or all of a mixture comprising the polyphenylene ether (A), the cyclophosphazene compound (B), the non-halogen-based epoxy resin (C), and the cyanate compound (D). Specific examples thereof include the same as those described above.

During the preparation of the resin composition, known treatment (stirring, mixing, and kneading treatment and the like) for uniformly dissolving or dispersing the components can be performed. For example, in the uniform dispersion of the filler (E), by performing stirring and dispersion treatment using a stirring vessel provided with a stirrer having suitable stirring ability, the dispersibility in the resin composition is enhanced. The above stirring, mixing, and kneading treatment can be appropriately performed, for example, using a known apparatus such as an apparatus intended for mixing such as a ball mill or a bead mill, or a revolution-rotation mixing apparatus.

[Applications]

The above resin composition can be preferably used as a prepreg, a metal foil-clad laminate, a single-layer resin sheet, a laminated resin sheet, or a printed wiring board and preferably used particularly as a prepreg, a metal foil-clad laminate, a single-layer resin sheet, a laminated resin sheet, or a printed wiring board for in-vehicle use. In these applications (particularly in-vehicle parts), the characteristics of heat resistance and flame retardancy are required. In this respect, the resin composition in this embodiment is a material that provides a prepreg, a resin sheet, a metal foil-clad laminate, and a printed wiring board that are excellent in flame retardancy, a coefficient of thermal expansion, heat resistance after moisture absorption, peel strength with copper foil, glass transition temperature, and electrical characteristics, and therefore the resin composition in this embodiment is useful. A prepreg, a metal foil-clad laminate, a single-layer resin sheet, a laminated resin sheet, or a printed wiring board will be described below, but these are not limited to in-vehicle use and can also be used in other conventionally known applications.

[Prepreg]

A prepreg in this embodiment comprises a base material; and the above resin composition with which the base material is impregnated or coated. The method for producing the prepreg can be performed according to an ordinary method and is not particularly limited. For example, the prepreg in this embodiment can be made by impregnating or coating a base material with the resin component in this embodiment, and then heating the base material with the resin component in a dryer at 100 to 200° C. for 1 to 30 minutes, or the like for semi-curing (B-staging).

The content of the resin composition (including the inorganic filler) is preferably 30 to 90% by mass, more preferably 35 to 85% by mass, and preferably 40 to 80% by mass based on the total amount of the prepreg. When the content of the resin composition is in the above range, the moldability tends to improve more.

The base material used in this embodiment is not particularly limited, and known ones used for various printed wiring board materials can be appropriately selected and used depending on the target application and performance. Specific examples thereof are not particularly limited and include glass fibers of E-glass, D-glass, S-glass, Q-glass, spherical glass, NE-glass, L-glass, T-glass, and the like, inorganic fibers of materials other than glass, such as quartz, and organic fibers of wholly aromatic polyamides such as polyparaphenylene terephthalamide (Kevlar (registered trademark), manufactured by DuPont) and copolyparaphenylene-3,4' oxydiphenylene-terephthalamide (Technora (registered trademark), manufactured by Teijin Techno Products Limited), polyesters such as 2,6-hydroxynaphthoic acid-parahydroxybenzoic acid (VECTRAN (registered trademark), manufactured by KURARAY CO., LTD.) and Zxion (registered trademark, manufactured by KB SEIREN, LTD.), polyparaphenylene benzoxazole (ZYLON (registered trademark), manufactured by Toyobo Co., Ltd.), polyimides, and the like. Among these, E-glass, NE-glass, and L-glass are preferred in terms of availability and a low dielectric loss tangent. One of these base materials can be used alone, or two or more of these base materials can be used in combination.

Examples of the shape of the base material include woven fabrics, nonwoven fabrics, rovings, chopped strand mats, and surfacing mats. In addition, examples of the weave of the woven fabric include plain weave, basket weave, and twill weave. The shape of the base material and the weave can be appropriately selected and used from these known ones depending on the target application and performance. In addition, base materials subjected to opening treatment, and glass woven fabrics surface-treated with silane coupling agents and the like are preferably used. The thickness and mass of the base material are not particularly limited, and generally those of about 0.01 to 0.3 mm are preferably used. Especially, in terms of strength and water absorbency, for the base material, glass woven fabrics having a thickness of 200 μm or less and a mass of 250 g/m$^2$ or less are preferred, and glass woven fabrics comprising glass fibers of E-glass are more preferred.

[Metal Foil-Clad Laminate]

A metal foil-clad laminate in this embodiment comprises a laminate of one or more of the above prepregs; and metal foil laminate-molded on one surface or both surfaces of the laminate. The method for producing the metal foil-clad laminate can be performed according to an ordinary method and is not particularly limited. For example, the metal foil-clad laminate can be obtained by stacking at least one or more of the above-described prepregs, disposing metal foil on one surface or both surfaces of the stack, and laminate-molding the metal foil and the stack. More specifically, the metal foil-clad laminate in this embodiment can be made by providing a configuration in which one or a plurality of the above-described prepregs are stacked, and metal foil of copper, aluminum, or the like is disposed on one surface or both surfaces of the stack as desired, and laminate-molding this as needed.

The metal foil used here is not particularly limited as long as it is one used for a printed wiring board material. Known copper foil such as rolled copper foil and electrolytic copper foil is preferred. In addition, the thickness of the metal foil is not particularly limited but is preferably 2 to 70 µm, more preferably 2 to 35 µm. The method for molding the metal foil-clad laminate and the molding conditions are also not particularly limited, and general methods and conditions for laminates and multilayer boards for printed wiring boards can be applied. For example, during the molding of the metal foil-clad laminate, a multistage press, a multistage vacuum press, a continuous molding machine, an autoclave molding machine, or the like can be used, and generally, the temperature is in the range of 100 to 300° C., the pressure is a surface pressure in the range of 2 to 100 kgf/cm$^2$, and the heating time is in the range of 0.05 to 5 hours. Further, post-curing can also be performed at a temperature of 150 to 300° C. as needed. In addition, a multilayer board can also be provided by laminate-molding the prepreg in this embodiment and a separately made wiring board for an inner layer in combination.

The above metal foil-clad laminate in this embodiment can be preferably used as a printed wiring board by forming a predetermined wiring pattern. The metal foil-clad laminate in this embodiment can be especially effectively used as a printed wiring board for high frequency and high multilayering which has a low thermal expansion rate, lead-free solderability, and good dielectric characteristics and of which such performance is required.

[Printed Wiring Board]

A printed wiring board in this embodiment comprises an insulating layer; and a conductor layer formed on one surface or both surfaces of the insulating layer, and the above insulating layer comprises the above resin composition. The method for producing the printed wiring board can be performed according to an ordinary method and is not particularly limited. The printed wiring board can be produced, for example, by the following method. First, a metal foil-clad laminate such as a copper-clad laminate in this embodiment is provided. The surfaces of the metal foil-clad laminate are subjected to etching treatment to form inner layer circuits to make an inner layer board. The inner layer circuit surfaces of this inner layer board are subjected to surface treatment for enhancing adhesive strength, as needed. Then, the required number of the prepregs in this embodiment are stacked on the inner layer circuit surfaces, metal foil for outer layer circuits is further laminated on the outside of the stack, and the laminate is heated and pressurized for integral molding. In this manner, a multilayer laminate in which insulating layers comprising a base material and a cured product of a thermosetting resin composition are formed between inner layer circuits and metal foil for outer layer circuits is produced. Then, this multilayer laminate is subjected to perforation for through holes and via holes, and then desmear treatment for removing smears that are resin residues derived from the resin component contained in the cured product layers is performed. Then, plating metal films that allow conduction between the inner layer circuits and the metal foil for outer layer circuits are formed on the wall surfaces of these holes. Further, the metal foil for outer layer circuits is subjected to etching treatment to form outer layer circuits, and a printed wiring board is produced.

The prepreg in this embodiment (the base material and the resin composition in this embodiment with which the base material is impregnated), and the resin composition layer of the metal foil-clad laminate (the layer comprising the resin composition in this embodiment) each constitute the insulating layer comprising the resin composition in this embodiment.

[Resin Sheet]

A laminated resin sheet in this embodiment comprises a sheet base material; and the above resin composition applied and dried on one surface or both surfaces of the sheet base material. The method for producing the laminated resin sheet can be performed according to an ordinary method and is not particularly limited. For example, the laminated resin sheet can be obtained by coating a sheet base material with a solution of the above resin composition in this embodiment dissolved in a solvent and drying the solution.

The sheet base material used here is not particularly limited. Examples thereof include organic film base materials such as polyethylene films, polypropylene films, polycarbonate films, polyethylene terephthalate films, ethylene tetrafluoroethylene copolymer films, and release films obtained by coating surfaces of these films with release agents, and polyimide films, conductor foil such as copper foil and aluminum foil, and plate-shaped base materials such as glass plates, SUS plates, and FRP.

Examples of the coating method include a method of coating a sheet base material with a solution of the resin composition in this embodiment dissolved in a solvent by a bar coater, a die coater, a doctor blade, a baker applicator, or the like.

In addition, a single-layer resin sheet in this embodiment is obtained by molding the above resin composition into a sheet shape. The method for producing the single-layer resin sheet can be performed according to an ordinary method and is not particularly limited. Examples thereof include a method of coating a sheet base material with a solution of the resin composition in this embodiment dissolved in a solvent and drying the solution in the above method for producing the laminated resin sheet, and then peeling or etching the sheet base material from the laminated resin sheet. The single-layer resin sheet (resin sheet) can also be obtained without using a sheet base material, by feeding a solution of the above resin composition in this embodiment dissolved in a solvent into a mold having a sheet-shaped cavity, and drying the solution, or the like for sheet shape molding.

In the making of the single-layer resin sheet or the laminated resin sheet in this embodiment, the drying conditions when the solvent is removed are not particularly limited but are preferably a temperature of 20° C. to 170° C. for 1 to 90 minutes because at low temperature, the solvent is likely to remain in the resin composition, and at high temperature, the curing of the resin composition proceeds.

In addition, the thickness of the resin layer of the single-layer sheet or laminated sheet in this embodiment can be adjusted by the concentration and coating thickness of the solution of the resin composition in this embodiment and is not particularly limited. The thickness is preferably 0.1 to 500 µm because generally, when the coating thickness increases, the solvent is likely to remain during drying.

EXAMPLES

This embodiment will be specifically described below using Synthesis Examples, Examples, and Comparative Examples, but this embodiment is not limited to these.

Synthesis Example 1

Synthesis of Acetylphenoxy Group-Containing Cyclic Phosphazene Compound

A 5 L four-necked flask equipped with a thermometer, a stirrer, a cooling tube, and a dropping funnel was charged with a THF (800 mL) solution of hexachlorocyclotriphosphazene (243.8 g, 2.10 unit mol) under a nitrogen gas flow, and a THF (1,000 mL) solution of sodium phenoxide (243.8 g, 2.10 mol) previously prepared was dropped therein at 20° C. or less over 1.5 hours. The reaction liquid obtained by stirring at 25° C. for 5 hours was added to a toluene (2,000 mL) suspension of sodium 4-acetylphenoxide (431.70 g, 2.73 mol) previously prepared, and the mixture was concentrated and refluxed at 110° C. for 3 hours. The reaction mixture was cooled to room temperature, and then toluene (1,000 mL) and a 5% sodium hydroxide aqueous solution (500 mL) were added, and the mixture was transferred to a separatory funnel. The aqueous layer was separated, and then the toluene layer was washed with a 5% sodium hydroxide aqueous solution (500 mL) and further neutralized with dilute nitric acid and water-washed. The toluene layer was concentrated under reduced pressure to obtain 556.55 g of the product (yield: 97.0%). The analysis results of this product were as follows:

1H-NMR spectrum (in deuterated acetone, δ, ppm): 2.6 (3H), 6.9-7.4 (7H), 7.8-8.0 (2H)

31P-NMR spectrum (in deuterated acetone, δ, ppm): 9.0-10.0 (trimer (P=N)$_3$)

13C-NMR spectrum (in deuterated acetone, δ, ppm): 26.0, 121.0, 125.5, 130.0, 134.5, 150.5, 154.0, 196.0

TOF-MS: 778, 820, 861

From the above analysis results, it was confirmed that the product obtained in this step was an acetylphenoxy group-containing cyclic phosphazene compound that was a mixture of [N$_3$P$_3$(OC$_6$H$_4$COCH$_3$)$_4$(OC$_6$H$_5$)$_2$], [N$_3$P$_3$(OC$_6$H$_4$COCH$_3$)$_3$(OC$_6$H$_5$)$_3$], and [N$_3$P$_3$(OC$_6$H$_4$COCH$_3$)$_2$(OC$_6$H$_5$)$_4$] whose average composition was [N$_3$P$_3$(OC$_6$H$_4$COCH$_3$)$_{3.0}$(OC$_6$H$_5$)$_{3.0}$].

Synthesis Example 2

Synthesis of Acetylphenoxy Group-Containing Cyclic Phosphazene Compound

A 5 L four-necked flask equipped with a thermometer, a stirrer, a cooling tube, and a dropping funnel was charged with a THF (800 mL) solution of hexachlorocyclotriphosphazene (243.4 g, 2.10 unit mol) under a nitrogen gas flow, and a THF (2,000 mL) solution of sodium 4-acetylphenoxide (797.0 g, 5.04 mol) previously prepared was dropped therein at 10 to 20° C. over 3.5 hours. Then, the mixture was stirred under reflux conditions for 15 hours. The reaction mixture was cooled to room temperature, and then the solvent was distilled off under reduced pressure, and the residue was diluted with toluene (2,000 mL). A 5% sodium hydroxide aqueous solution (500 mL) was added, and the mixture was transferred to a separatory funnel. The aqueous layer was separated, and then the toluene layer was washed with a 5% sodium hydroxide aqueous solution (500 mL) and further neutralized with dilute nitric acid and water-washed. The toluene layer was concentrated under reduced pressure to obtain 642.19 g of the product (yield: 97.0%). The analysis results of this product were as follows:

1H-NMR spectrum (in deuterated acetone, δ, ppm): 2.5 (3H), 7.0 (2H), 7.7 (2H)

31P-NMR spectrum (in deuterated acetone, δ, ppm): 9.0-10.0 (trimer (P=N)$_3$)

13C-NMR spectrum (in deuterated acetone, δ, ppm): 26.0, 125.5, 134.5, 154.0, 196.0

TOF-MS: 946

From the above analysis results, it was confirmed that the product obtained in this step was an acetylphenoxy group-containing cyclic phosphazene compound that was [N$_3$P$_3$(OC$_6$H$_4$COCH$_3$)$_6$].

Synthesis Example 3

Synthesis of Cyclophosphazene Compound "A" Having Vinyl Group (Reduction Step)

A 5 L autoclave was charged with a THF (3,000 mL) solution of the acetylphenoxy group-containing cyclic phosphazene compound obtained in Synthesis Example 1 (546.44 g, 2.0 unit mol) under a nitrogen gas flow, and 10 w % palladium-activated carbon (5.46 g) was added thereto. Next, the inside of the autoclave was pressurized with hydrogen, and the mixture was aged at room temperature for 5 hours. After the completion of the reaction was confirmed, Pd/C was filtered off, and THF was distilled off under reduced pressure. Then, 534.0 g of the product was obtained (yield 97.0%). The analysis results of this product were as follows:

1H-NMR spectrum (in deuterated acetone, δ, ppm): 1.4 (3H), 4.8-5.0 (1H), 6.8-7.4 (9H)

31P-NMR spectrum (in deuterated acetone, δ, ppm): 10.0 (trimer (P=N)$_3$)

13C-NMR spectrum (in deuterated acetone, δ, ppm): 26.0, 68.5, 121.0, 125.0, 127.0, 130.0, 144.0, 149.5, 151.0

TOF-MS: 782, 826, 870

From the above analysis results, it was confirmed that this product was a hydroxyethylphenoxy group-containing cyclic phosphazene compound that was a mixture of [N$_3$P$_3$(OC$_6$H$_4$CHOHCH$_3$)$_4$(OC$_6$H$_5$)$_2$], [N$_3$P$_3$(OC$_6$H$_4$CHOHCH$_3$)$_3$(OC$_6$H$_5$)$_3$], and [N$_3$P$_3$(OC$_6$H$_4$CHOHCH$_3$)$_2$(OC$_6$H$_5$)$_4$] whose average composition was [N$_3$P$_3$(OC$_6$H$_4$CHOHCH$_3$)$_3$(OC$_6$H$_5$)$_3$].

(Dehydration Step)

A 5 L reactor equipped with a thermometer, a stirrer, and a cooling tube was charged with a toluene (1,000 mL) solution of the hydroxyethylphenoxy group-containing cyclic phosphazene compound obtained in the above reduction step (275.24 g, 1.0 unit mol) under a nitrogen gas flow, and potassium hydrogen sulfate (13.8 g) was added thereto. The mixture was stirred under reflux conditions for 3 hours, concentrated, and then stirred at 140° C. for 5 hours. After the completion of the reaction was confirmed, dilution with toluene (1,000 mL) and water washing were performed, and then the toluene layer was concentrated under reduced pressure to obtain 213.49 g of the product (yield: 83.0%). The analysis results of this product were as follows:

1H-NMR spectrum (in deuterated acetone, δ, ppm): 5.1 (1H), 5.6 (1H), 6.6 (1H), 6.7-7.3 (9H)

31P-NMR spectrum (in deuterated acetone, δ, ppm): 9.5-10.5 (trimer (P=N)$_3$)

IR spectrum (KBr Pellet, cm$^{-1}$): 3100, 1629, 1264, 1200-1160, 950

TOF-MS: 746, 772, 798

From the above analysis results, it was confirmed that this product was a cyclophosphazene compound having a vinyl group that was a mixture of [N$_3$P$_3$(OC$_6$H$_4$CH=CH$_2$)$_4$(OC$_6$H$_5$)$_2$], [N$_3$P$_3$(OC$_6$H$_4$CH=CH$_2$)$_3$(OC$_6$H$_5$)$_3$], and [N$_3$P$_3$(OC$_6$H$_4$CH=CH$_2$)$_2$(OC$_6$H$_5$)$_4$] whose average composition was [N$_3$P$_3$(OC$_6$H$_4$CH=CH$_2$)$_3$(OC$_6$H$_5$)$_3$]. The vinyl group equivalent of the cyclophosphazene compound was 257 g/eq.

Synthesis Example 4

Synthesis of Cyclophosphazene Compound "B" Having Vinyl Group (Reduction Step)

309.7 g of a product was obtained (yield 97.0%) by the same operation as the reduction step in Synthesis Example 3 except that instead of the acetylphenoxy group-containing cyclic phosphazene compound obtained in Synthesis Example 1, the acetylphenoxy group-containing cyclic phosphazene compound obtained in Synthesis Example 2 (315.26 g, 1.00 unit mol) was used. The analysis results of this product were as follows:

1H-NMR spectrum (in deuterated acetone, δ, ppm): 1.4 (3H), 4.8-5.0 (1H), 6.8-7.4 (4H)

31P-NMR spectrum (in deuterated acetone, δ, ppm): 10.0 (trimer (P=N)$_3$)

13C-NMR spectrum (in deuterated acetone, δ, ppm): 26.0, 68.5, 121.0, 127.0, 144.0, 149.5

TOF-MS: 958

From the above analysis results, it was confirmed that this product was a hydroxyethylphenoxy group-containing cyclic phosphazene compound that was [N$_3$P$_3$(OC$_6$H$_4$CHOHCH$_3$)$_6$].

(Dehydration Step)

117.55 g of a product was obtained (yield 83.0%) by the same operation as the dehydration step in Synthesis Example 3 except that instead of the hydroxyethylphenoxy group-containing cyclic phosphazene compound obtained in the reduction step in Synthesis Example 3, the hydroxyethylphenoxy group-containing cyclic phosphazene compound obtained in the above reduction step (159.7 g, 0.50 unit mol) was used. The analysis results of this product were as follows:

1H-NMR spectrum (in deuterated chloroform, δ, ppm): 5.1 (1H), 5.6 (1H), 6.6 (1H), 6.7-7.3 (4H)

31P-NMR spectrum (in deuterated chloroform, δ, ppm): 9.5-10.5 (trimer (P=N)$_3$)

IR spectrum (KBr Pellet, cm$^{-1}$): 3100, 1629, 1264, 1200-1160, 950

TOF-MS: 850

From the above analysis results, it was confirmed that this product was a cyclophosphazene compound having a vinyl group that was [N$_3$P$_3$(OC$_6$H$_4$CH=CH$_2$)$_6$]. The vinyl group equivalent of the cyclophosphazene compound was 141.5 g/eq.

Synthesis Example 5

Synthesis of α-Naphthol Aralkyl-Based Cyanate Resin

A reactor to which a thermometer, a stirrer, a dropping funnel, and a reflux condenser were attached was previously cooled to 0 to 5° C. with brine and was charged with 7.47 g (0.122 mol) of cyanogen chloride, 9.75 g (0.0935 mol) of 35% hydrochloric acid, 76 ml of water, and 44 ml of methylene chloride.

While the temperature in this reactor and the pH were kept at −5 to +5° C. and 1 or less respectively, a solution of 20 g (0.0935 mol) of an α-naphthol aralkyl (SN485, OH group equivalent: 214 g/eq., softening point: 86° C., manufactured by Nippon Steel Chemical Co., Ltd.) and 14.16 g (0.14 mol) of triethylamine dissolved in 92 ml of methylene chloride was dropped by the dropping funnel under stirring over 1 hour. After the completion of the dropping, 4.72 g (0.047 mol) of triethylamine was further dropped over 15 minutes.

After the completion of the dropping, the mixture was stirred at the same temperature for 15 minutes, and then the reaction liquid was separated, and the organic layer was fractionated. The obtained organic layer was washed twice with 100 ml of water, and then the methylene chloride was distilled off under reduced pressure by an evaporator. Finally, the residue was concentrated to dryness at 80° C. for 1 hour to obtain 23.5 g of the target cyanate compound represented by the following formula (14).

The obtained cyanate compound was analyzed by liquid chromatography and an IR spectrum. No raw material peak was detected. In addition, the structure was identified by 13C-NMR and 1H-NMR. The conversion rate from an OH group to a cyanato group was 99% or more.

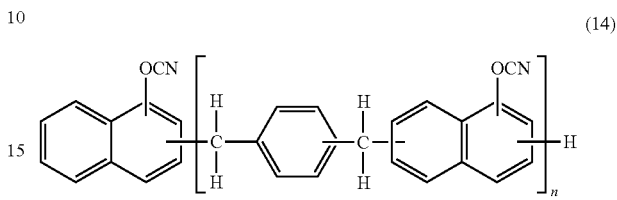

(14)

wherein n represents an integer of 1 to 50.

Example 1

70 Parts by mass of vinylbenzyl-modified polyphenylene ether (OPE-2St 1200, manufactured by MITSUBISHI GAS CHEMICAL COMPANY, INC., number average molecular weight 1187, vinyl group equivalent: 590 g/eq.), 15 parts by mass of the cyclophosphazene compound "A" having a vinyl group obtained by Synthesis Example 3, 5 parts by mass of a naphthalene skeleton-modified novolac-based epoxy resin (HP-9900, manufactured by DIC, epoxy equivalent: 275 g/eq.), 10 parts by mass of the α-naphthol aralkyl-based cyanate resin obtained by Synthesis Example 5, and 100 parts by mass of spherical silica (SC2050, manufactured by Admatechs Company Limited, average particle diameter 0.5 μm) were mixed, and the solids were diluted with methyl ethyl ketone to 65% by mass to obtain a varnish.

An E-glass cloth having a thickness of 0.08 mm (IPC No. #3313) was impregnated and coated with this obtained varnish, and heated and dried at 170° C. for 5 minutes using a dryer (pressure-resistant explosion-proof steam dryer, manufactured by Takasugi-Seisakusho)) to obtain a prepreg comprising 55% by mass of a resin composition. Eight of the prepregs were stacked, and 18 μm copper foil (3EC-III, manufactured by Mitsui Mining & Smelting Co., Ltd.) was disposed on both surfaces. The stack was subjected to vacuum pressing at a pressure of 30 kg/cm$^2$ and a temperature of 210° C. for 150 minutes to obtain an 18 μm copper-clad laminate having a thickness of 0.8 mm. Using the obtained copper-clad laminate, the evaluations of flame resistance, a coefficiency of thermal expansion, heat resistance after moisture absorption, glass transition temperature, electrical characteristics (dielectric loss tangent), and peel strength were performed. The results are shown in Table 1.

(Measurement Methods)

1) Flame Resistance:

The flame resistance was evaluated according to the UL94 vertical test method (n=5).

2) Coefficiency of Thermal Expansion (α1: Thermal Expansion Rate at Glass Transition Temperature or Less, α2: Thermal Expansion Rate at Glass Transition Temperature or More The coefficiency of thermal expansion in the thickness direction was measured by the TMA method (Thermomechanical analysis) defined in J1S C 6481. The coefficiency of thermal expansion was evaluated by the average measured value of two measurements based on the following evaluation criteria:

◯: α1 was 50 ppm/° C. or less, and α2 was 250 ppm/° C. or less x: other than the above 3) Heat Resistance after Moisture Absorption:

The entire copper foil of the copper-clad laminate (50 mm×50 mm×0.8 mm) except half of the copper foil on one surface was removed by etching to obtain a test piece. The obtained test piece was treated at 121° C. and 2 atmospheres by a pressure cooker tester (manufactured by HIRAYAMA MANUFACTURING CORPORATION, model PC-3) for 5 hours and then immersed in solder at 288° C. for 30 seconds. Three samples were subjected to the above test. The presence or absence of blisters after the immersion was visually observed, and the heat resistance after moisture absorption was evaluated based on the following evaluation criteria:

○: there was no abnormality in all of three samples
x: blisters occurred in at least one sample 4) Glass Transition Temperature (Tg):

The glass transition temperature was measured by a DMA method (Dynamic Mechanical Analysis).

5) Dielectric Loss Tangent:

The copper foil of the copper-clad laminate was removed to obtain a test piece. Using the obtained test piece, the dielectric loss tangent at 10 GHz was measured by a cavity resonator perturbation method (Agilent 8722ES, manufactured by Agilent Technologies), and the average value of five measurements was obtained. The dielectric loss tangent was evaluated by the obtained value based on the following evaluation criteria:

○: less than 0.005
x: 0.005 or more

6) Peel Strength:

Using the copper-clad laminate (30 mm×150 mm×0.8 mm), the copper foil peel strength was measured according to JIS C6481. The peel strength was evaluated by the average measured value of two measurements based on the following evaluation criteria:

○: 0.8 kN/m or more
x: less than 0.8 kN/m

Example 2

50 Parts by mass of polyphenylene ether (SA90, manufactured by SABIC Innovative Plastics, number average molecular weight 1700), 25 parts by mass of the cyclophosphazene compound "A" having a vinyl group obtained by Synthesis Example 3, 5 parts by mass of a naphthalene skeleton-modified novolac-based epoxy resin (HP-9900), 20 parts by mass of the α-naphthol aralkyl-based cyanate resin obtained by Synthesis Example 5, and 75 parts by mass of spherical silica (SC2050) were mixed, and the solids were diluted with methyl ethyl ketone to 65% by mass to obtain a varnish. The above evaluations were performed as in Example 1 except that this varnish was used. The physical property values of the obtained copper-clad laminate are shown in Table 1.

Example 3

70 Parts by mass of vinylbenzyl-modified polyphenylene ether (OPE-2St), 15 parts by mass of the cyclophosphazene compound "B" having a vinyl group obtained by Synthesis Example 4, 5 parts by mass of a naphthalene skeleton-modified novolac-based epoxy resin (HP-9900), 10 parts by mass of the α-naphthol aralkyl-based cyanate resin obtained by Synthesis Example 5, and 100 parts by mass of spherical silica (SC2050) were mixed, and the solids were diluted with methyl ethyl ketone to 65% by mass to obtain a varnish. The above evaluations were performed as in Example 1 except that this varnish was used. The physical property values of the obtained copper-clad laminate are shown in Table 1.

Example 4

65 Parts by mass of vinylbenzyl-modified polyphenylene ether (OPE-2St), 15 parts by mass of the cyclophosphazene compound "A" having a vinyl group obtained by Synthesis Example 3, 5 parts by mass of a cresol novolac-based epoxy resin (N680, manufactured by DIC, epoxy equivalent: 215 g/eq.), 5 parts by mass of a bisphenol A-based epoxy resin (E-1051, manufactured by DIC, epoxy equivalent: 475 g/eq.), 10 parts by mass of the α-naphthol aralkyl-based cyanate resin obtained by Synthesis Example 5, and 100 parts by mass of spherical silica (SC2050) were mixed, and the solids were diluted with methyl ethyl ketone to 65% by mass to obtain a varnish. The above evaluations were performed as in Example 1 except that this varnish was used. The physical property values of the obtained copper-clad laminate are shown in Table 1.

Example 5

70 Parts by mass of vinylbenzyl-modified polyphenylene ether (OPE-2St), 15 parts by mass of the cyclophosphazene compound "A" having a vinyl group obtained by Synthesis Example 3, 3 parts by mass of a naphthalene skeleton-modified novolac-based epoxy resin (HP-9900), 12 parts by mass of a bisphenol A-based cyanate compound (CA210, manufactured by MITSUBISHI GAS CHEMICAL COMPANY, INC., cyanate equivalent: 139 g/eq.), and 100 parts by mass of spherical silica (SC2050) were mixed, and the solids were diluted with methyl ethyl ketone to 65% by mass to obtain a varnish. The above evaluations were performed as in Example 1 except that this varnish was used. The physical property values of the obtained copper-clad laminate are shown in Table 1.

Example 6

77 Parts by mass of vinylbenzyl-modified polyphenylene ether (OPE-2St), 15 parts by mass of the cyclophosphazene compound "A" having a vinyl group obtained by Synthesis Example 3, 3 parts by mass of a naphthalene skeleton-modified novolac-based epoxy resin (HP-9900), 5 parts by mass of a bisphenol A-based cyanate compound (CA210), and 40 parts by mass of spherical silica (SC2050) were mixed, and the solids were diluted with methyl ethyl ketone to 65% by mass to obtain a varnish. The above evaluations were performed as in Example 1 except that this varnish was used. The physical property values of the obtained copper-clad laminate are shown in Table 1.

Example 7

55 Parts by mass of vinylbenzyl-modified polyphenylene ether (OPE-2St), 20 parts by mass of the cyclophosphazene compound "A" having a vinyl group obtained by Synthesis Example 3, 10 parts by mass of a naphthalene skeleton-modified novolac-based epoxy resin (HP-9900), 15 parts by mass of the α-naphthol aralkyl-based cyanate resin obtained by Synthesis Example 5, and 120 parts by mass of spherical silica (SC2050) were mixed, and the solids were diluted with methyl ethyl ketone to 65% by mass to obtain a varnish. The above evaluations were performed as in Example 1 except that this varnish was used. The physical property values of the obtained copper-clad laminate are shown in Table 1.

Comparative Example 1

15 Parts by mass of the cyclophosphazene compound "A" having a vinyl group obtained by Synthesis Example 3, 30 parts by mass of a naphthalene skeleton-modified novolac-based epoxy resin (HP-9900), 55 parts by mass of the α-naphthol aralkyl-based cyanate resin obtained by Synthesis Example 5, and 100 parts by mass of spherical silica (SC2050) were mixed, and the solids were diluted with methyl ethyl ketone to 65% by mass to obtain a varnish. The above evaluations were performed as in Example 1 except that this varnish was used. The physical property values of the obtained copper-clad laminate are shown in Table 2.

Comparative Example 2

70 Parts by mass of vinylbenzyl-modified polyphenylene ether (OPE-2St), 10 parts by mass of a naphthalene skeleton-modified novolac-based epoxy resin (HP-9900), 20 parts by mass of the α-naphthol aralkyl-based cyanate resin obtained by Synthesis Example 5, and 100 parts by mass of spherical silica (SC2050) were mixed, and the solids were diluted with methyl ethyl ketone to 65% by mass to obtain a varnish. The above evaluations were performed as in Example 1 except that this varnish was used. The physical property values of the obtained copper-clad laminate are shown in Table 2.

Comparative Example 3

70 Parts by mass of vinylbenzyl-modified polyphenylene ether (OPE-2St), 15 parts by mass of the cyclophosphazene compound "A" having a vinyl group obtained by Synthesis Example 3, 15 parts by mass of the α-naphthol aralkyl-based cyanate resin obtained by Synthesis Example 5, and 100 parts by mass of spherical silica (SC2050) were mixed, and the solids were diluted with methyl ethyl ketone to 65% by mass to obtain a varnish. The above evaluations were performed as in Example 1 except that this varnish was used. The physical property values of the obtained copper-clad laminate are shown in Table 2.

Comparative Example 4

70 Parts by mass of vinylbenzyl-modified polyphenylene ether (OPE-2St), 15 parts by mass of the cyclophosphazene compound "A" having a vinyl group obtained by Synthesis Example 3, 15 parts by mass of a naphthalene skeleton-modified novolac-based epoxy resin (HP-9900), and 100 parts by mass of spherical silica (SC2050) were mixed, and the solids were diluted with methyl ethyl ketone to 65% by mass to obtain a varnish. The above evaluations were performed as in Example 1 except that this varnish was used. The physical property values of the obtained copper-clad laminate are shown in Table 2.

Comparative Example 5

70 Parts by mass of vinylbenzyl-modified polyphenylene ether (OPE-2St), 15 parts by mass of the cyclophosphazene compound "A" having a vinyl group obtained by Synthesis Example 3, 5 parts by mass of a naphthalene skeleton-modified novolac-based epoxy resin (HP-9900), and 10 parts by mass of the α-naphthol aralkyl-based cyanate resin obtained by Synthesis Example 5 were mixed, and the solids were diluted with methyl ethyl ketone to 65% by mass to obtain a varnish. The above evaluations were performed as in Example 1 except that this varnish was used. The physical property values of the obtained copper-clad laminate are shown in Table 2.

Comparative Example 6

The above evaluations were performed as in Example 1 except that instead of the cyclophosphazene compound "A" having a vinyl group obtained by Synthesis Example 3, a cyanophenoxyphosphazene compound (FP-300, manufactured by FUSHIMI Pharmaceutical Co., Ltd.) was used. The physical property values of the obtained copper-clad laminate are shown in Table 2.

Comparative Example 7

The above evaluations were performed as in Example 1 except that instead of the cyclophosphazene compound "A" having a vinyl group obtained by Synthesis Example 3, a phenoxyphosphazene compound (FP-100, manufactured by FUSHIMI Pharmaceutical Co., Ltd.) was used. The physical property values of the obtained copper-clad laminate are shown in Table 2.

Comparative Example 8

The above evaluations were performed as in Example 1 except that instead of the cyclophosphazene compound "A" having a vinyl group obtained by Synthesis Example 3, a phosphorylphenanthrene compound (HCA, manufactured by SANKO CO., LTD.) was used. The physical property values of the obtained copper-clad laminate are shown in Table 2.

Comparative Example 9

The above evaluations were performed as in Example 1 except that instead of the cyclophosphazene compound "A" having a vinyl group obtained by Synthesis Example 3, a phosphorus-containing cyanate compound (FR-300, manufactured by Lonza, cyanate equivalent: 187 g/eq.) was used. The physical property values of the obtained copper-clad laminate are shown in Table 2.

Comparative Example 10

62 Parts by mass of vinylbenzyl-modified polyphenylene ether (OPE-2St), 5 parts by mass of a phosphorus-containing cyanate compound (FR-300), 15 parts by mass of a phenoxyphosphazene compound (FP-100), 5 parts by mass of a naphthalene skeleton-modified novolac-based epoxy resin (HP-9900), 10 parts by mass of the α-naphthol aralkyl-based cyanate resin obtained by Synthesis Example 5, 3 parts by mass of a styrene oligomer (KA3085, manufactured by Eastman Chemical Japan Ltd., number average molecular weight 604), and 100 parts by mass of spherical silica (SC2050) were mixed, and the solids were diluted with methyl ethyl ketone to 65% by mass to obtain a varnish. The above evaluations were performed as in Example 1 except that this varnish was used. The physical property values of the obtained copper-clad laminate are shown in Table 2.

TABLE 1

| Evaluation item | Unit | Example 1 | Example 2 | Example 3 | Example 4 | Example 5 | Example 6 | Example 7 |
|---|---|---|---|---|---|---|---|---|
| Flame resistance | — | V-0 | V-0 | V-0 | V-0 | V-0 | V-0 | V-0 |
| Coefficiency of thermal expansion | ppm/°C. | ○ | ○ | ○ | ○ | ○ | ○ | ○ |
| Heat resistance after moisture absorption | — | ○ | ○ | ○ | ○ | ○ | ○ | ○ |
| Glass transition temperature | °C. | 255 | 265 | 251 | 253 | 257 | 256 | 262 |
| Dielectric loss tangent | — | ○ | ○ | ○ | ○ | ○ | ○ | ○ |
| Peel strength | kN/m | ○ | ○ | ○ | ○ | ○ | ○ | ○ |

TABLE 2

| Evaluation item | Unit | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 |
|---|---|---|---|---|---|---|---|---|---|---|---|
| Flame resistance | — | V-0 | V-1 | V-0 | V-0 | V-1 | V-0 | V-0 | V-0 | V-0 | V-0 |
| Coefficiency of thermal expansion | ppm/°C. | ○ | ○ | ○ | ○ | x | x | x | x | ○ | ○ |
| Heat resistance after moisture absorption | — | ○ | ○ | x | ○ | x | ○ | ○ | x | x | ○ |
| Glass transition temperature | °C. | 252 | 230 | 253 | 251 | 252 | 210 | 210 | 190 | 235 | 210 |
| Dielectric loss tangent | — | x | ○ | ○ | x | x | ○ | ○ | x | ○ | ○ |
| Peel strength | kN/m | ○ | ○ | x | ○ | ○ | ○ | ○ | x | ○ | ○ |

From the above results, it was found that by combining the polyphenylene ether (A), the cyclophosphazene compound (B), the non-halogen-based epoxy resin (C), the cyanate compound (D), and the filler (E) as the resin composition according to this embodiment, it was possible to satisfy all of flame retardancy, heat resistance, electrical characteristics, and peel strength. In addition, it was found that when at least one of any component was not contained, the deterioration of at least one of any characteristics of flame retardancy, heat resistance, electrical characteristics, and peel strength was seen.

This application is based on Japanese Patent Application No. 2014-43504 filed with the Japan Patent Office on Mar. 6, 2014, the contents of which are incorporated herein by reference.

INDUSTRIAL APPLICABILITY

The resin composition in this embodiment has industrial applicability as a material of a prepreg, a metal foil-clad laminate, a single-layer resin sheet, a laminated resin sheet, or a printed wiring board. Particularly, the resin composition in this embodiment has industrial applicability as a material of a prepreg, a metal foil-clad laminate, a single-layer resin sheet, a laminated resin sheet, or a printed wiring board for in-vehicle use.

The invention claimed is:
1. A resin composition comprising:
a polyphenylene ether (A) having a number average molecular weight of 500 to 5000 and comprising a compound represented by the following formula (4):

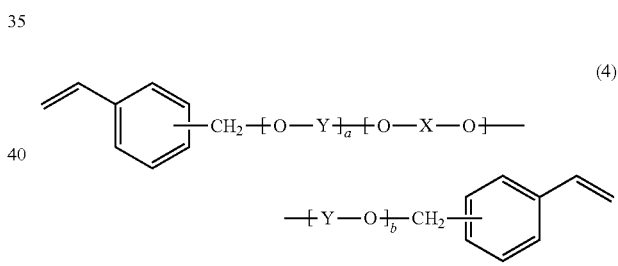

wherein X represents a group represented by the following formula (5) or the following formula (6), Y each independently represents a group represented by the following formula (7), a and b each represent an integer of 0 to 100, and at least either one of a and b is 1 or more,

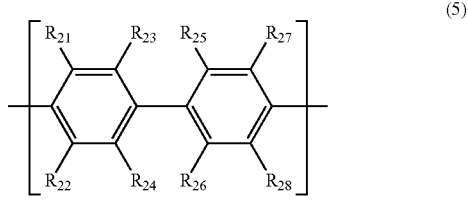

wherein $R_{21}$, $R_{22}$, $R_{23}$, $R_{27}$, and $R_{28}$ each independently represent an alkyl group having 6 or less carbon atoms or a phenyl group, and $R_{24}$, $R_{25}$, and $R_{26}$ each independently represent a hydrogen atom, an alkyl group having 6 or less carbon atoms, or a phenyl group,

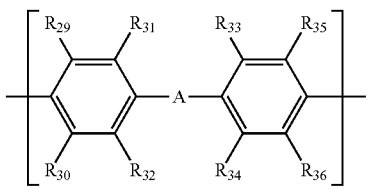

(6)

wherein $R_{29}$, $R_{30}$, $R_{31}$, $R_{32}$, $R_{33}$, $R_{34}$, $R_{35}$, and $R_{36}$ each independently represent a hydrogen atom, an alkyl group having 6 or less carbon atoms, or a phenyl group, and A represents a linear, branched, or cyclic divalent hydrocarbon group having 20 or less carbon atoms,

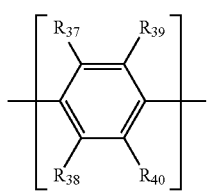

(7)

wherein $R_{39}$ and $R_{40}$ each independently represent an alkyl group having 6 or less carbon atoms or a phenyl group, and $R_{37}$ and $R_{38}$ each independently represent a hydrogen atom, an alkyl group having 6 or less carbon atoms, or a phenyl group;
  a cyclophosphazene compound (B) represented by the following formula (13);
  a non-halogen-based epoxy resin (C);
  a cyanate compound (D); and
  a filler (E),

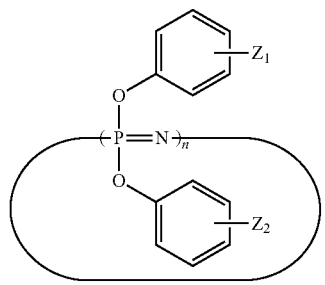

(13)

wherein $Z_1$ and $Z_2$ each independently represents a vinyl group or a hydrogen atom, at least either one of $Z_1$ and $Z_2$ is a vinyl group, and n represents an integer of 3 to 8 and
wherein a ratio of the vinyl group equivalent of the cyclophosphazene compound (B) to the vinyl group equivalent of the polyphenylene ether (A) is from 0.2 to 4.

2. The resin composition according to claim 1, wherein a content of the polyphenylene ether (A) is 40 to 80 parts by mass based on 100 parts by mass of a total of the (A) to (D) components.

3. The resin composition according to claim 1, wherein a content of the cyclophosphazene compound (B) is 10 to 30 parts by mass based on 100 parts by mass of the total of the (A) to (D) components.

4. The resin composition according to claim 1, wherein the non-halogen-based epoxy resin (C) comprises any one or more selected from the group consisting of a naphthalene-modified epoxy resin, a cresol novolac-based epoxy resin, and a bisphenol A-based epoxy resin.

5. The resin composition according to claim 1, wherein a content of the non-halogen-based epoxy resin (C) is 2 to 20 parts by mass based on 100 parts by mass of the total of the (A) to (D) components.

6. The resin composition according to claim 1, wherein the cyanate compound (D) comprises a bisphenol A-based cyanate compound and/or a naphthol aralkyl-based cyanate compound.

7. The resin composition according to claim 1, wherein a content of the cyanate compound (D) is 5 to 30 parts by mass based on 100 parts by mass of the total of the (A) to (D) components.

8. The resin composition according to claim 1, wherein a content of the filler (E) is 20 to 150 parts by mass based on 100 parts by mass of the total of the (A) to (D) components.

9. The resin composition according to claim 1, wherein the filler (E) comprises a silica.

10. The resin composition according to claim 1, for use in a prepreg, a metal foil-clad laminate, a single-layer resin sheet, a laminated resin sheet, or a printed wiring board for in-vehicle use.

11. A prepreg comprising:
  a base material; and
  the resin composition according to claim 1 with which the base material is impregnated or coated.

12. A metal foil-clad laminate comprising:
  a laminate of one or more of the prepregs according to claim 11; and
  metal foil laminate-molded on one surface or both surfaces of the laminate.

13. A single-layer resin sheet obtained by molding the resin composition according to claim 1 into a sheet shape.

14. A laminated resin sheet comprising:
  a sheet base material; and
  the resin composition according to claim 1 applied and dried on one surface or both surfaces of the sheet base material.

15. A printed wiring board comprising:
  an insulating layer; and
  a conductor layer formed on one surface or both surfaces of the insulating layer, wherein
  the insulating layer comprises the resin composition according to claim 1.

* * * * *